United States Patent [19]
Nishimoto

[11] Patent Number: 6,043,427
[45] Date of Patent: Mar. 28, 2000

[54] PHOTOVOLTAIC DEVICE, PHOTOELECTRIC TRANSDUCER AND METHOD OF MANUFACTURING SAME

[75] Inventor: Tomonori Nishimoto, Kyotanabe, Japan

[73] Assignee: Canon Kabushiki Kaisha, Tokyo, Japan

[21] Appl. No.: 09/025,794

[22] Filed: Feb. 19, 1998

[30] Foreign Application Priority Data

Feb. 19, 1997 [JP] Japan .................................. 9-035126
Feb. 17, 1998 [JP] Japan .................................. 10-34661

[51] Int. Cl.[7] .................................................. H01L 25/00
[52] U.S. Cl. ........................... 136/258; 257/458; 438/96; 438/97
[58] Field of Search ........................ 136/258; 257/458; 438/96, 97

[56] References Cited

U.S. PATENT DOCUMENTS 5,589,007 12/1996 Fujioka et al. ........................ 136/258
5,769,963 6/1998 Fujioka et al. ........................ 136/258

FOREIGN PATENT DOCUMENTS 57-187971 11/1982 Japan .

*Primary Examiner*—Mark Chapman
*Attorney, Agent, or Firm*—Fitzpatrick Cella, Harper & Scinto

[57] ABSTRACT

A photovoltaic device and a photoelectric transducer having a pin-structure semiconductor layer formed by superposing a p-type semiconductor layer, an i-type semiconductor layer and an n-type semiconductor layer wherein the i-type semiconductor layer comprises a non-single crystal semiconductor and average grain size distribution of crystal grains of the i-type semiconductor layer is not uniform are provided. Methods of manufacturing the photovoltaic device and the photoelectric transducer are also provided. The manufacturing methods according to the invention can produce photovoltaic devices and photoelectric transducers having an excellent photoelectric conversion efficiency and a remarkable optical stability at an enhanced rate and at low cost.

30 Claims, 5 Drawing Sheets

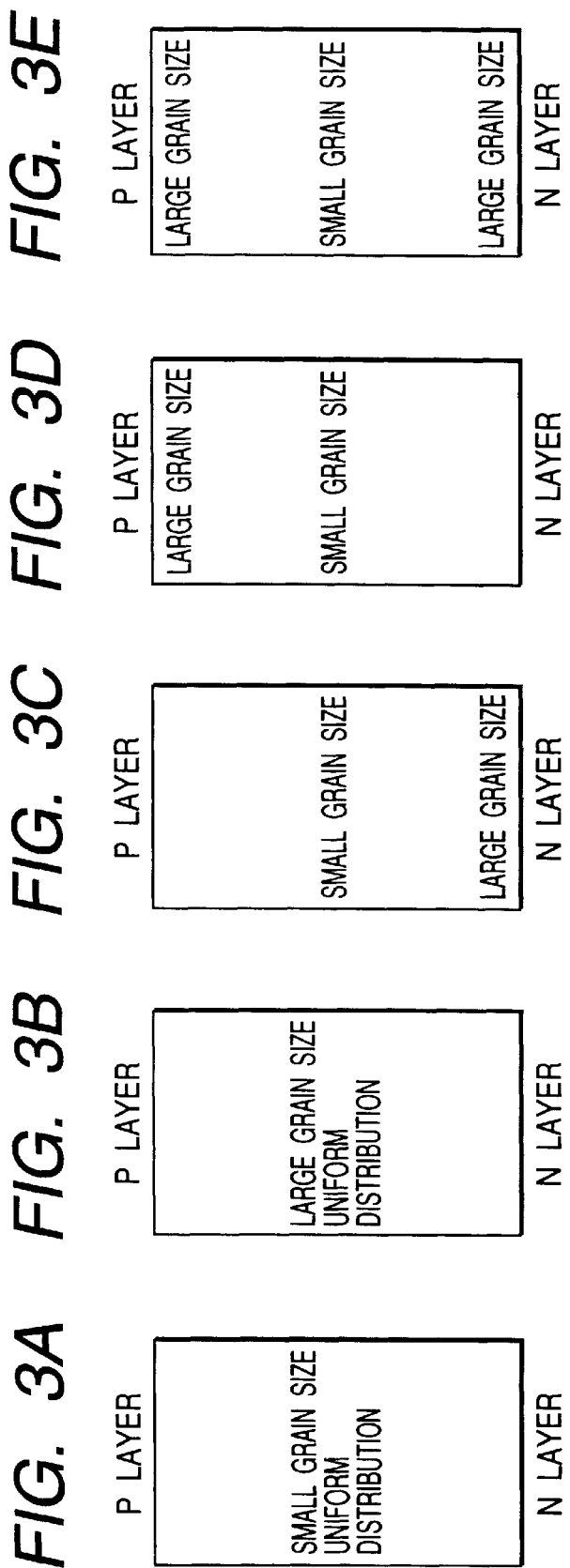

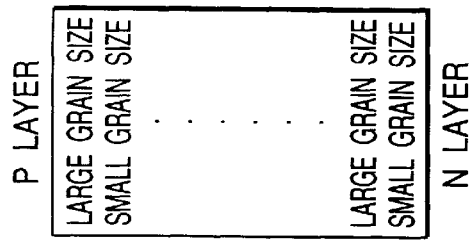
FIG. 3I
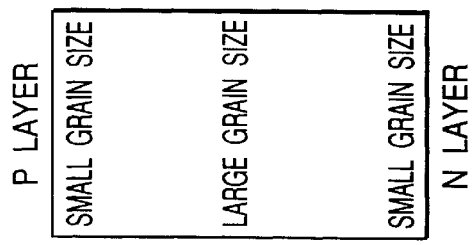
FIG. 3H
FIG. 3G
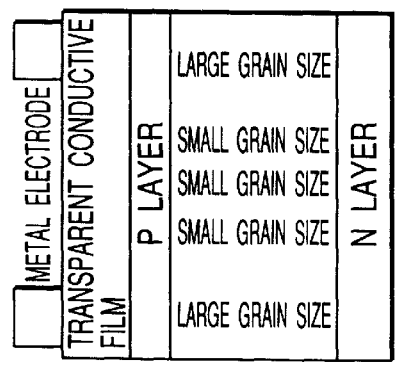
FIG. 3K
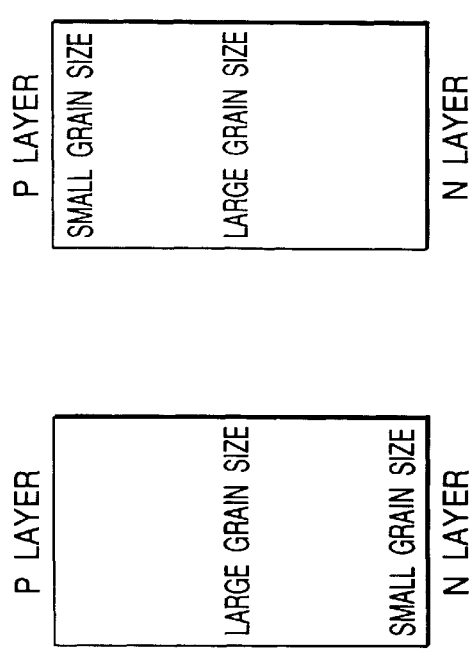
FIG. 3F
FIG. 3J

PHOTOVOLTAIC DEVICE, PHOTOELECTRIC TRANSDUCER AND METHOD OF MANUFACTURING SAME

BACKGROUND OF THE INVENTION

1. Field of the Invention

The present invention relates to a pin-type photovoltaic device and a photoelectric transducer using non-single crystal silicon such as amorphous silicon, microcrystalline silicon or polycrystalline silicon. It also relates to a method of manufacturing such a photovoltaic device and such a photoelectric transducer.

2. Related Background Art

The plasma CVD method typically using radio-frequency (RF) electric waves of 13.56 MHz has been popularly known in the manufacture of pin-type photovoltaic devices, such as solar cells, and photoelectric transducers, such as photosensors, using amorphous silicon film. However, with the plasma CVD method using 13.56 MHz, it has been realized that the quality of the produced film is disproportionally degraded when the speed of producing the thin film is raised. This means that it is difficult to increase the throughput in order to make the method adapted to mass production.

The plasma CVD method typically using microwaves (MW) of 2.45 GHz has been utilized as an alternative that can produce relatively high quality thin film if the thin film producing speed is raised. For example, an i-type semiconductor layer prepared by a microwave plasma CVD method is reported in Kazufumi Azuma, Takeshi Watanabe and Juichi Shimada, "a-Si Solar Cells Prepared by Using a Microwave Plasma CVD Method";

Preliminary Papers for the 50th Applied Physics Society Lecture Meeting, pp. 566.

A thin film photovoltaic device using amorphous silicon thin film typically has a pin structure and its i-type semiconductor layer is principally responsible for photoelectric conversion. FIG. 1 of the accompanying drawings schematically shows a known typical pin-type photovoltaic device comprising a substrate 101, an n-type (or p-type) semiconductor layer 102, an i-type semiconductor layer 103, a p-type (or n-type) semiconductor layer 104, a transparent electrode 105 and a collector electrode 106.

Numerous efforts have been made to improve the junction characteristics of thin film photovoltaic devices by using microcrystals for the p-type and n-type semiconductor layers. For example, Japanese Patent Application Laid-Open No. 57-187971 discloses a method in which an i-type semiconductor layer comprises amorphous silicon, wherein the improvement in the output current and the output voltage of the device lies in using microcrystalline silicon with an average grain size of less than 100 angstroms at least for the p-type semiconductor layer or the n-type semiconductor layer located on the light receiving side of the device.

However, pin-type solar cells using amorphous silicon for the i-type semiconductor layer can be accompanied by the undesired phenomenon (referred to as Staebler-Wronski effect) of an increased flaw density in the i-type semiconductor layer that gives rise to a reduced photoelectric conversion efficiency when irradiated with light. Such a harmful phenomenon is vital in practical applications.

In recent years, efforts have been paid to use i-type microcrystalline silicon for the photoelectric conversion layer of amorphous silicon type thin film photovoltaic devices. Pin-type solar cells comprising an i-type semiconductor layer of microcrystalline silicon are advantageous in that they are not degraded by light. For example, Shah et al. of Neufchatel University reported at the 25th IEEE PV Specialists Conference, Washington, May 13–17, 1996 a pin-type solar cell comprising a p-type semiconductor layer, an i-type semiconductor layer and an n-type semiconductor layer, all of which are made of microcrystalline silicon, that shows a photoelectric conversion efficiency of 7.7% and is not degraded by light. While Shah et al. use a high frequency wave plasma CVD method that is essentially same as any known methods for preparing a microcrystalline silicon i-type semiconductor layer, they also use a VHF band frequency of 110 MHz to generate plasma.

On the other hand, according to the report by Shah et al. of Neufchatel University, they realized a deposition rate of 1.2 angstroms per second for a microcrystalline silicon i-type semiconductor layer having a thickness of 3.6 $\mu$m. By a rule of thumb, it is clear that it takes more than 8 hours to form a microcrystalline silicon i-type semiconductor layer with such a method. While a solar cell having such an i-type semiconductor layer shows a high photoelectric conversion efficiency and is free from degradation by light, the throughput will be extremely poor in manufacturing and hence it will be very difficult to manufacture such solar cells feasibly at low cost.

In order to manufacture pin-type solar cells comprising a microcrystalline silicon i-type semiconductor layer on a realistic mass production basis, it is absolutely necessary to dramatically raise the rate of forming a microcrystalline silicon i-type semiconductor layer from the currently available level. However, it has been evidenced by a number of studies that, when the rate of forming amorphous silicon or microcrystalline silicon is simply raised in a conventional film-forming process, the produced film shows a poor quality due to inhibition of lattice relaxation at an outer most surface of the produced film.

It is true that lattice relaxation can be promoted by raising the temperature of the base member. Then, however, the dopant such as phosphor (or boron) in the n-type semiconductor layer (or the p-type semiconductor layer) prepared prior to the i-type semiconductor layer can be diffused into the i-type semiconductor layer to damage the quality of the layer and consequently the operating characteristics of the prepared solar cell. It is believed that i-type microcrystalline silicon produced by high frequency plasma CVD is inherently a weak n-type and hence any diffusion of n-type dopants such as phosphor into i-type microcrystalline silicon should be suppressed.

While microcrystalline silicon is promising if compared with amorphous silicon because the former shows a higher photostability than the latter, known microcrystalline silicon have disadvantages that have to be dissolved.

SUMMARY OF THE INVENTION

An object of the present invention is to provide a photovoltaic device, a photoelectric transducer and a method for manufacturing the same.

In other words, an object of the present invention is to provide a device for which an i-type non-single crystal silicon layer, particularly an i-type microcrystalline silicon layer, having excellent electric and optical characteristics can be formed when the rate of forming the semiconductor layer is raised to several to tens of several angstroms per second, and a method of manufacturing such a device.

Another object of the present invention is to suppress the adverse effect of the diffusion of dopants such as phosphor and boron from the n-type semiconductor layer or the p-type semiconductor layer by reducing the time required to form the i-type non-single crystal silicon layer or the i-type microcrystalline silicon layer, in particular.

Still another object of the present invention is to provide a multilayer structure photovoltaic device having an i-type semiconductor layer for which microcrystalline silicon can be used to improve the short-circuit photoelectric current and the open current voltage, while reducing the degradation by light, in order to improve the conversion efficiency of the photovoltaic device and the productivity of manufacturing such devices.

In the invention, an i-type semiconductor layer refers to a substantially intrinsic semiconductor layer. In other words, an i-type semiconductor layer as used herein may be a layer of semiconductor that is no longer perfectly intrinsic semiconductor because it is made to contain trace amounts of impurities.

According to an aspect of the invention, the above objects are achieved by providing a photovoltaic device or a photoelectric transducer having a pin-structure semiconductor layer formed by superposing a p-type semiconductor layer, an i-type semiconductor layer and an n-type semiconductor layer to a multilayer structure, wherein the i-type semiconductor layer comprises non-single crystal silicon semiconductor and the average grain size distribution of the crystal grains of the i-type semiconductor layer is not uniform.

According to another aspect of the invention, there is provided a method of manufacturing a photovoltaic device or a photoelectric transducer having a pin-structure semiconductor layer formed by superposing a p-type semiconductor layer, an i-type semiconductor layer and an n-type semiconductor layer to a multilayer structure, wherein the i-type semiconductor layer is formed by means of high frequency plasma CVD using a frequency of 50 to 2,450 MHz, pressure of 0.001 to 0.5 Torr and a making current density of 0.001 to 0.5 W/cm$^3$.

In particular, the average grain size distribution of the crystal grains in the i-type semiconductor layer can be made to be not uniform by varying the film forming conditions during film formation.

BRIEF DESCRIPTION OF THE DRAWINGS

FIGS. 3A, 3B, 3C, 3D, 3E, 3F, 3G, 3H, 3I, 3J and 3K show different grain size distributions in the i-type semiconductor layer of a photovoltaic device according to the invention.

DESCRIPTION OF THE PREFERRED EMBODIMENTS

Figure 1:
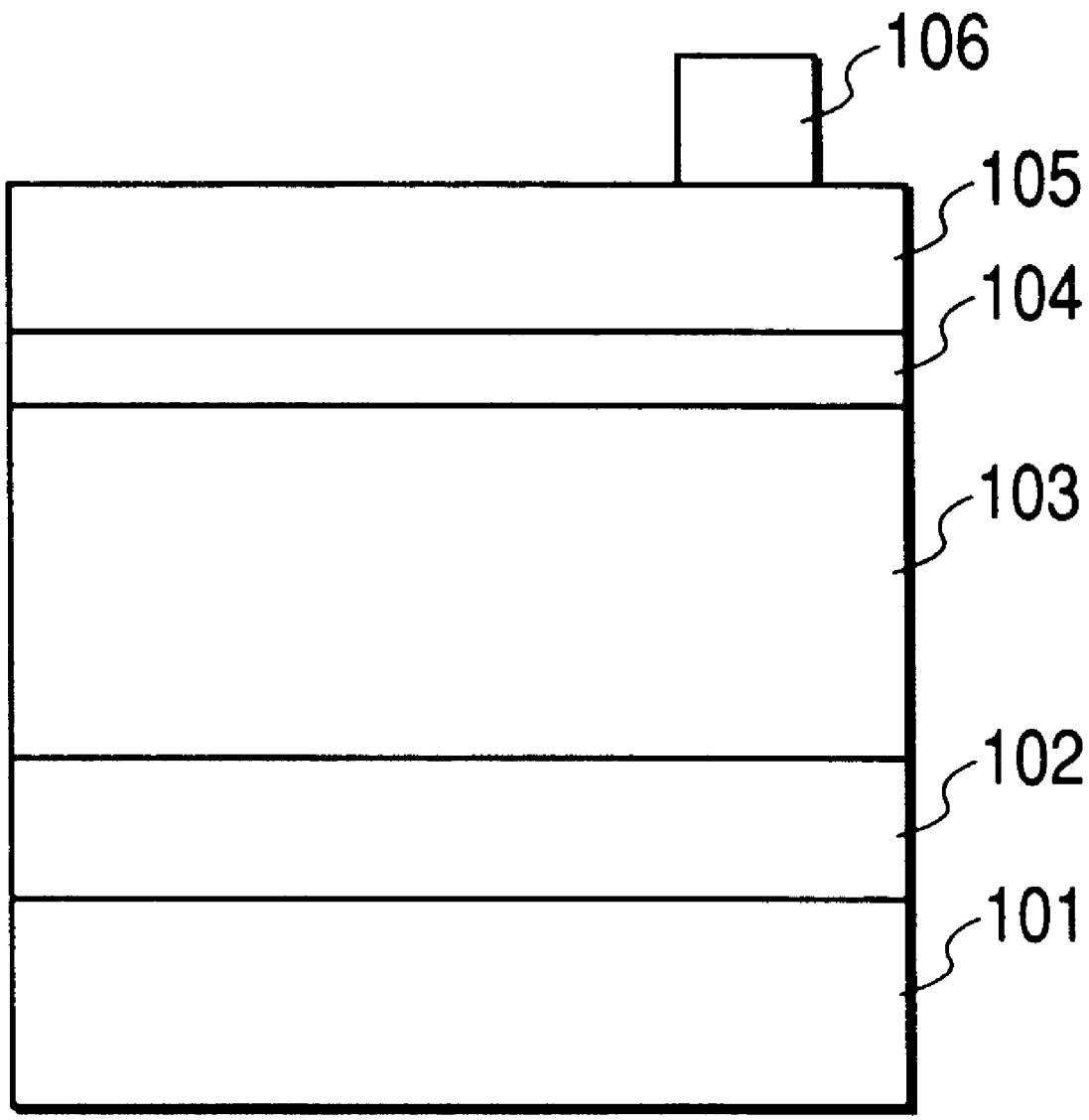
FIG. 1 is a schematic cross sectional view of an example photovoltaic device.

Now, the present invention will be described in greater detail by referring to preferred modes of carrying out the invention.

Firstly an embodiment of photovoltaic device according to the invention will be described by referring to FIG. 1. The photovoltaic device comprises a base member 101, an n-type semiconductor layer (or a p-type semiconductor layer) 102, an i-type semiconductor layer 103, a p-type semiconductor layer (or an n-type semiconductor layer) 104, a transparent electrode 105 and a collector electrode 106. Alternatively, a metal layer (a back electrode layer) and a transparent conductive layer are arranged on the substrate 101 with an n-type semiconductor layer (or a p-type semiconductor layer) 102 laid thereon.

Now, each of the layers of the photovoltaic device will be described.

(Substrate)

The substrate 101 is made of an appropriate conductive or insulating material, which may be metal, resin, glass, a ceramic material or semiconductor bulk. It may have a smooth surface or a finely undulated surface with peaks having a height of 0.1 to 1.0 μm. When the substrate 101 is a conductive substrate or some other opaque substrate, light should be allowed to strike the device from the side opposite to the substrate. Alternatively, a transparent substrate may be used for the substrate 101 so that light may enter the device through the substrate 101.

The substrate 101 preferably has the shape of a sheet, a roll formed from a sheet, or a cylinder.

If a conductive material is used for the substrate 101, it is preferably selected from metals including plated steel, NiCr, stainless steel, Al, Cr, Mo, Au, Nb, Ta, V, Ti, Pt, Pb and Sn and alloys of any of them.

If an insulating material is used for the substrate 101, it may be selected from polyester, polyethylene, polycarbonate, cellulose acetate, polypropylene, polyvinylchloride, polyvinylidenechloride, polystyrene, polyamide and other synthetic resin materials, glass, ceramic materials and paper.

The substrate 101 may have any appropriate thickness, which can be made very small when the substrate is required to be flexible in the process of manufacturing the photovoltaic device, although it is preferably not less than 10 μm to ensure a certain degree of mechanical strength.

The surface of the substrate 101 may be chemically etched or jaggedly cut in order to provide the substrate 101 with undulations on the surface (texture the surface). More specifically, the surface is treated to produce undulations in a controlled manner by means of chemical surface treatment such as chemical polishing or electrolytic polishing or mechanical polishing using diamond, carborundum or alundum and thereafter etched to eliminate multiply undulated areas.

A continuous strip of substrate may be used for a continuous film forming operation. If such is the case, a continuous strip of a flexible material such as stainless steel or polyimide may suitably be used for the purpose of the invention.

(Back Electrode Layer)

The back electrode layer is an electrode layer formed on the side of the device opposite to the side from which light enters as viewed from the semiconductor layers. The back electrode layer serves as an electrode and, at the same time, as a reflection layer for reflecting the light that has been transmitted through the semiconductor layers so that it may be reutilized by the semiconductor layers.

The back electrode layer is preferably made of metal selected from gold, silver, copper, aluminum, nickel, iron, chromium, molybdenum, tungsten, titanium, cobalt, tantalum, niobium and zirconium or an alloy such as stainless steel or AlSi, of which aluminum, copper, silver and gold are highly preferred because of their high reflectivity.

The back electrode layer can be formed by vapor deposition, sputtering, plating, electrolytic deposition using aqueous solution or printing.

The back electrode layer preferably has a thickness of 10 nm to 5,000 nm.

By providing the surface of the back electrode layer with undulations, reflected light is made to follow a prolonged optical path in the semiconductor layers to increase the short-circuit current (Jsc) of the device.

The back electrode layer may have a multilayer structure of a plurality of layers. If the substrate 101 is conductive, the back electrode layer may be omitted. However, the use of a back electrode layer is a prerequisite when the substrate 101 is made of an insulating material.

(Transparent Conductive Layer)

The transparent conductive layer is arranged between the back electrode layer and the semiconductor layers in order to increase the irregular reflection at the back electrode layer. More specifically, light is trapped in the photovoltaic device and made to follow a prolonged optical path in the semiconductor layers to increase the short-circuit current (Jsc) of the photovoltaic device by the textured surface of the back electrode layer that irregularly reflects light and the transparent conductive layer that reflects light multiply. Additionally, the transparent conductive layer plays the role of preventing the metal of the back electrode layer from diffusing or migrating into the semiconductor layers to shunt the photovoltaic device. It also prevents any short-circuiting from taking place due to the flaws in the semiconductor layers such as pin holes if it is made to show an appropriate level of resistance.

Preferably, the electric conductivity of the transparent conductive layer is between $10^{-8}$ (1/Ωcm) and $10^{-1}$ (1/Ωcm). The transparent conductive layer is required to show a high transmittance. Preferably, it passes 80% or more, preferably 85% or more, most preferably 90% or more, of light with a wavelength of longer than 650 nm that enters it. The transparent conductive layer may have an appropriate thickness depending on the refractivity of the material to be used and may suitably be from 50 nm to 10 μm.

The transparent conductive layer is formed from an conductive oxide such as ZnO, ITO (indium tin oxide), $In_2O_3$, $SnO_2$, $TiO_2$, CdO, $Cd_2Sn_4$, $Bi_2O_3$, $MoO_3$ or $Na_xWO_3$ by means of an appropriate film forming technique selected from vapor deposition, sputtering, electrolytic deposition, CVD, spray, spin-on, dipping and plating. A conductivity modifying agent may be added to the oxide. For texturing the transparent conductive layer, the process of forming the layer is conducted at temperature 200° C. or more. The textured effect of the layer can be improved by etching the surface with weak acid after the layer is formed.

(Semiconductor Layers)

The material to be used for the semiconductor layers according to the invention is selected from the Group IV elements such as Si, C and Ge and alloys thereof including SiGe, SiC and SiSn.

Preferably, the semiconductor layers of a photovoltaic device are made of a material selected from non-single crystal semiconductors prepared by using any of the Group IV elements and their alloys including a-Si:H (hydrogenated amorphous silicon), a-Si:F, a-Si:H:F, a-SiGe:H, a-SeGe:F, a-SiGe:H:F, a-SiC:H, a-SiC:F, a-SiC:H:F. The semiconductor layers can be controlled for valence electrons and the forbidden band width. To do this, the compound material of the semiconductor layers is made to contain a valence electron control agent and/or a forbidden band width control agent and introduced into the film forming space solely or as a diluted or non-diluted mixture source gas containing it and other film depositing materials.

Each of the semiconductor layers is doped at least partly to the p-type and the n-type to form at least one pin-structure. Then, a stacked cell structure is produced by laying a plurality of pin-structures.

Japanese Patent Application Laid-Open No. 62-209871 discloses a technique of gradually increasing the degree of microcrystallization of the non-single crystal i-type semiconductor layer toward the p-type semiconductor layer or the n-type semiconductor layer in order to improve the junctioning effect of the p/i or n/i interface particularly when the p-type semiconductor layer or the n-type semiconductor layer is made of microcrystalline silicon. However, the disclosed technique is simply intended to increase the degree of crystallization at the p/i or n/i interface of an amorphous i-type semiconductor layer and the patent application does not disclose anything about the crystal grain size distribution of the i-type semiconductor layer. The crystal grain size and the degree of crystallization are totally different factors in the semiconductor layers and either of them cannot be unequivocally defined by defining the other.

As will be described hereinafter, the quantum effect, the multiple reflection effect and the effect of controlling the diffusion length of electric current carriers in a pin-type solar cell can be controlled highly effectively by controlling the crystal grain size if compared with any instance where only the degree of crystallization is controlled.

To the contrary, the degree of crystallization simply refers to the extent to which the semiconductor material is found in the form of crystals. When the degree of crystallization is simply raised, the semiconductor may contain crystals that are very small or unnecessarily large or a mixture of ordinarily-sized crystals and extremely large crystals produced as a result of abnormal growth. A photovoltaic device comprising deposited layers that have been controlled only in terms of the degree of crystallization may operate effectively to some extent, but it will be far from satisfactory from the viewpoint of the quantum effect, the multiple reflection effect and the effect of controlling the diffusion length of electric current carriers that can be realized by controlling the grain size.

In short, the technique disclosed in the above identified patent application is totally different particularly in terms of objects and effects from the method of the present invention for controlling the crystal grain size distribution to make it not uniform but found certain numerical ranges.

Japanese Patent Application Laid-Open No. 63-58974 discloses a method of forming a p-type semiconductor layer from a crystalline part (p1) and a amorphous part (p2) and gradually decreasing the degree of crystallization of the crystalline part (p1) toward the amorphous part (p2). However, as in the case of the first known method, this method is simply intended to change the extent of crystallinity of the p-type semiconductor layer that serves as an electrode layer and the patent application does not refer to anything about the crystal grain size distribution in the i-type semiconductor layer having a region of photoelectric conversion. Therefore, again, the technique disclosed in the above identified patent application is totally different particularly in terms of objects and effects from the method of the present invention for controlling the crystal grain size distribution to make it to be not uniform but found certain numerical ranges.

In conventional pin-type microcrystalline silicon solar cells, the i-type semiconductor layer shows a uniform grain size distribution in a layer as shown in FIG. 3A or 3B. While microcrystalline silicon still has physical properties to be clarified, it typically shows a light absorption coefficient far greater than single crystal silicon. This may be attributable to the quantum effect due to the grain size of microcrystalline particle (as it is possible to produce a quantum effect by controlling the grain size to improve the light absorption coefficient from that of large crystals) and the effect of multiple reflection of light among crystal grains (that can be regulated by controlling the grain size and hence the reflective surface size and the density of crystal grain boundaries because light is reflected well on crystal grain boundaries). The grain size of microcrystalline silicon is preferably hundreds of several angstroms or less in order to make these effects noticeable. There is also a need for increasing the diffusion length of electric current carriers by raising the grain size of microcrystalline silicon in order to make the device perform well (as electric current carriers can diffuse well in a single crystal grain but crystal grain boundaries can provide barriers for the diffusion of electric current carriers). Therefore, the conventional use of uniform grain size distribution in the i-type semiconductor cannot meet the above apparently contradictory two requirements at the same time.

In view of this problem and as a result of intensive research efforts paid on the relationship between the crystal grain boundary and the performance of a photovoltaic device, the inventor of the present invention came to find that the performance of a photovoltaic device can be remarkably improved by optimally controlling the grain size in different regions of the i-type semiconductor layer. Now, the semiconductor layers (and the i-type semiconductor layer in particular) will be discussed below in greater detail.

According to the invention, the grain size distribution of crystal grains in the i-type semiconductor layer is intentionally made to be non-uniform in the film thickness direction and/or in the direction along the surface thereof (surface direction). FIGS. 3C through 3I illustrate combinations of different grain sizes on and near the p/i and n/i interfaces and in other regions.

FIGS. 3C through 3E (large grain size on and near the p- and n-interfaces)

The junctioning effect of the p-type semiconductor layer and the n-type semiconductor layer can be improved by using a large grain size on and near the p/i and n/i interfaces. The arrangement of FIG. 3C where a large grain size is used in and near the n-type semiconductor layer provides an effect of suppressing the diffusion of phosphor from the n-type semiconductor layer. The arrangement of FIG. 3D where a large grain size is used in and near the p-type semiconductor layer provides a remarkable effect of improving the open current voltage and the fill factor because the junctioning effect is improved on the side of receiving incident light. In FIG. 3E, a large grain size is used in and near the p-type and n-type semiconductor layers at the same time to obtain the effect of FIG. 3C and that of FIG. 3D. The arrangements of FIGS. 3C through 3E can provide an excellent absorption of light and a large photo-generated electric current because small crystal grains are used in areas other than the p/i and n/i interfaces in the i-type semiconductor layer (the i-type semiconductor bulk region). While the grain size may change discontinuously, it preferably changes continuously because the interface level density can be reduced in the i-type semiconductor to suppress the recombination of photo-generated carriers.

FIGS. 3F through 3H (small grain size on and near the p/i and n/i interfaces)

The arrangements in FIGS. 3F through 3H are suited for rapidly forming microcrystals with a relatively large grain size. The diffusion length of photo-generated carriers is remarkably increased to produce a pin-type solar cell having excellent fill factors when the crystal grain size is large in the i-type semiconductor layer bulk region. However, it should be noted that the i-type semiconductor layer bulk operates like single crystal silicon when the grain size is increased. In turn, the film thickness has to be increased to make the solar cell operate satisfactorily. When a small grain size is used for microcrystals on and near the p/i and n/i interfaces according to the invention, they absorb light and mechanical stresses efficiently and effectively to bring forth the effect of reducing the film thickness of i-type semiconductor layer bulk of crystals having a large grain size and, at the same time, suppressing any defects that can be caused by the difference in the expansion coefficient between the p-type semiconductor layer and the n-type semiconductor layer. When the grain size of the p-type semiconductor layer or the n-type semiconductor layer is made considerably smaller than that of the i-type semiconductor layer bulk, the small grain size region near the interface can alleviate the mismatch that can occur on the junction. The small grain size region may be located on the side of the n/i interface as shown in FIG. 3F, on the side of the p/i interface as shown in FIG. 3G or on the side of the n/i interface and also on the side of the p/i interface as shown in FIG. 3H. As pointed out above, while the grain size may change discontinuously, it preferably changes continuously because the interface level density can be reduced in the i-type semiconductor to suppress the recombination of photo-generated carriers.

FIG. 3I (cyclic repetition of small and large grain sizes in the layer thickness direction)

With this arrangement, a synergism of the effect of small grain size of increased absorption of light and stress and that of large grain size of an increased diffusion length. Additionally, the mobility of photo-generated carriers and hence the fill factors can be improved by forming quantum wells, utilizing the difference in the band gap between small-sized crystal grains and large-sized crystal grains. While the grain size may change discontinuously, it preferably changes continuously because the interface level density can be reduced in the i-type semiconductor layer to suppress the recombination of photo-generated carriers.

FIG. 3J (uneven grain size in the surface direction)

For the purpose of the invention, the grain size may preferably be not uniform in the surface direction. In this case again, there is a synergism of the effect of small grain size of increased absorption of light and stress and that of large grain size of an increased diffusion length. While the grain size may change discontinuously, it preferably changes continuously because the interface level density can be reduced in the i-type semiconductor layer to suppress the recombination of photo-generated carriers.

FIG. 3K (cyclic repetition of small and large grain sizes in the surface direction)

For modularizing photovoltaic devices such as solar cells, collector electrodes are arranged at regular intervals. Therefore, the efficiency of collecting photo-generated carriers can be improved by arranging cyclically and regularly small and large grains in the surface direction in such a way that large crystal grains are found under the collector electrodes. In this case again, while the grain size may change discontinuously, it preferably changes continuously because the interface level density can be reduced in the i-type semiconductor layer to suppress the recombination of photo-generated carriers.

The description below is related to the above discussions.

The hydrogen content of the region having a maximum average grain size in the i-type semiconductor layer is preferably smaller than that of the remaining regions. More preferably, the hydrogen content of the region having a maximum average grain size in the i-type semiconductor layer is 10% or less and that of the remaining regions in the i-type semiconductor layer is between 3 and 20%. Besides, the ratio of the smallest average grain size to the largest average grain size in the i-type semiconductor layer is preferably 0.9 or less. Additionally, the non-single crystal silicon is constituted by microcrystalline silicon having a minimum average grain size between 20 angstroms and 1 µm and microcrystalline silicon or polycrystalline silicon having a maximum average grain size between 50 angstroms and 10 mm. Still additionally, it is preferable that the dopant concentration in the i-type semiconductor layer is $2\times10^{17}$ $cm^{-3}$ or less on and near the n/i interface. Furthermore, it is preferable that the n-type and/or p-type semiconductor layers comprise microcrystalline silicon. Additionally, it is preferable that an i-type amorphous silicon interface layer is arranged between the i-type semiconductor layer and the n-type and/or between the i-type semiconductor layer and the p-type semiconductor layer. Still additionally, the non-single crystal silicon is preferably formed under pressure by high frequency plasma CVD with a frequency between 50 and 2,450 MHz, a forming pressure between 0.001 and 0.5 Torr and a making current density between 0.001 and 0.5 $W/cm^3$.

The effects of the present invention can be enhanced by controlling the grain size and the hydrogen content depending on the characteristics of the solar cell to be formed and the productivity of manufacturing solar cells.

For example, where solar cells having a high open current voltage are needed, a relatively high hydrogen content may well be selected within the range as defined above for the purpose of the invention. To the contrary, where solar cells having an improved photo-stability are needed, the hydrogen content may well be reduced within the rage as defined above for the purpose of the invention. For increasing the rate of forming the i-type semiconductor layer in order to raise the productivity of manufacturing solar cells, a relatively high frequency and a large making current density may well be selected within the respective ranges as defined above for the purpose of the invention.

(Doped Layers (n-type Semiconductor Layer, p-type Semiconductor Layer)

The base material of the doped layer is a semiconductor material such as amorphous silicon or microcrystalline silicon. Amorphous (as simply expressed by a-) silicon type semiconductor materials that can be used for the purpose of the invention may be selected from a-Si, a-SiC, a-SiO, a-SiN, a-SiCO, a-SiON, a-SiNC and a-SiCON. The base material may be an amorphous silicon semiconductor containing microcrystalline silicon. The rate of introducing a valence electron control agent in order to produce a p- or n-conduction type is preferably between 1,000 ppm and 10%. Hydrogen (H, D) and fluorine operate to compensate dangling bonds and improve the doping effect. The content of hydrogen and fluorine is optimally between 0.1 and 30 atom %. Carbon, oxygen and nitrogen are introduced to show a concentration between 0.1 ppm and 20% and between 0.1 ppm and 1% when a low concentration is desired. As for electric characteristics, the activation energy level is preferably 0.2 eV or less and the specific electric resistance is preferably 100 Ωcm or less, most preferably 1 Ωcm or less.

(i-type Semiconductor Layer)

The i-type semiconductor layer takes the most important role in a photovoltaic device according to the invention as it generates and transports photo-excited carrier. Non-single crystal silicon that can be used for the purpose of the invention is formed by high frequency plasma CVD with a frequency range between 13.56 MHz and 2.45 GHz and its absorption coefficient shows a photon energy dependency more on amorphous silicon on the high energy side and on crystalline silicon on the low energy side. For the purpose of the invention, the performance of a pin-type solar cell is improved by making the grain size distribution of crystal grains in the i-type semiconductor layer to be not uniform. Therefore, any of the arrangements illustrated in FIGS. 3C through 3K can preferably be used for the purpose of the invention.

The hydrogen content of the region having a maximum average grain size in the i-type semiconductor layer is preferably smaller than the hydrogen content of the remaining regions in the i-type semiconductor layer. More preferably, the hydrogen content of the region having a maximum average grain size in the i-type semiconductor layer is 10% or less and that of the remaining regions in the i-type semiconductor layer is between 3 and 20%. Besides, the ratio of the smallest average grain size to the largest average grain size in the i-type semiconductor layer is preferably 0.9 or less. Additionally, the non-single crystal silicon is constituted by microcrystalline silicon having a minimum average grain size between 20 angstroms and 1 µm and microcrystalline silicon or polycrystalline silicon having a maximum average grain size between 50 angstroms and 10 mm. Preferably, the n-type semiconductor layer is substantially undoped on and near the n/i interface. Furthermore, it is preferable that the n-type and/or p-type semiconductor layers comprise microcrystalline silicon. Additionally, it is preferable that an i-type amorphous silicon interface layer is arranged between the i-type semiconductor layer and the n-type and/or between the i-type semiconductor layer and the p-type semiconductor layer. Still additionally, the non-single crystal silicon is preferably formed under pressure by high frequency plasma CVD with a frequency between 50 and 2,450 MHz, a forming pressure between 0.001 and 0.5 Torr and a making current density between 0.001 and 0.5 $W/cm^3$.

(Transparent Electrode)

The transparent electrode 105 can be made to operate as an anti-reflection film by selecting an appropriate film thickness for it.

The transparent electrode layer is formed from a material such as ZnO, ITO (indium tin oxide), $In_2O_3$ or $SnO_2$ by means of an appropriate film forming technique selected from vapor deposition, CVD, spray, spin-on and immersion. A conductivity modifying agent may be added to the compound.

Substances that can suitably be used for modifying the conductivity include Al, In, B, Ga, Si and F when the transparent electrode is made of ZnO. A substance selected from Sn, F, Te, Ti, Sb and Pb can suitably be used when the transparent electrode is made of $In_2O_3$. A substance selected from F, Sb, P, As, In, Tl, Te, W, Cl, Br and I can suitably be used when the transparent electrode is made of $SnO_2$.

The transparent electrode is required to show a high transmittance. Preferably, it passes 85% or more of light at a wavelength of 550 nm that enters it. Preferably, the resistivity of the transparent electrode layer is $5\times10^{-3}$ Ωcm or less, more preferably $1\times10^{-3}$ Ωcm or less.

(Collector Electrode)

The collector electrode 106 is provided to improve the collecting efficiency. It may be formed by producing a pattern of the electrode metal by sputtering using a mask, by printing with conductive paste or solder paste or by bonding a metal wire with conductive paste.

If necessary, a protective layer may be formed on the both surfaces of the photovoltaic device. Additionally, a reinforcing material such as sheet steel may be used with the protective layer.

While the configuration of a photovoltaic device having a pin structure according to the invention is described above, it should be noted that the use of a pinpin or pinpinpin structure realized by laying more than one pin structures, or the use of a nip, nipnip or nipnipnip structure realized by laying more than one nip structures may also be used for a photovoltaic device according to the invention.

While the present invention is described above mainly in terms of photovoltaic device, a photoelectric transducer according to the invention has a configuration essentially identical with the one described above.

EXAMPLES

Now, the present invention will be described by way of examples of preparing photovoltaic devices according to the invention. It should be noted, however, that the present invention is not limited thereto in any means.

Figure 2:
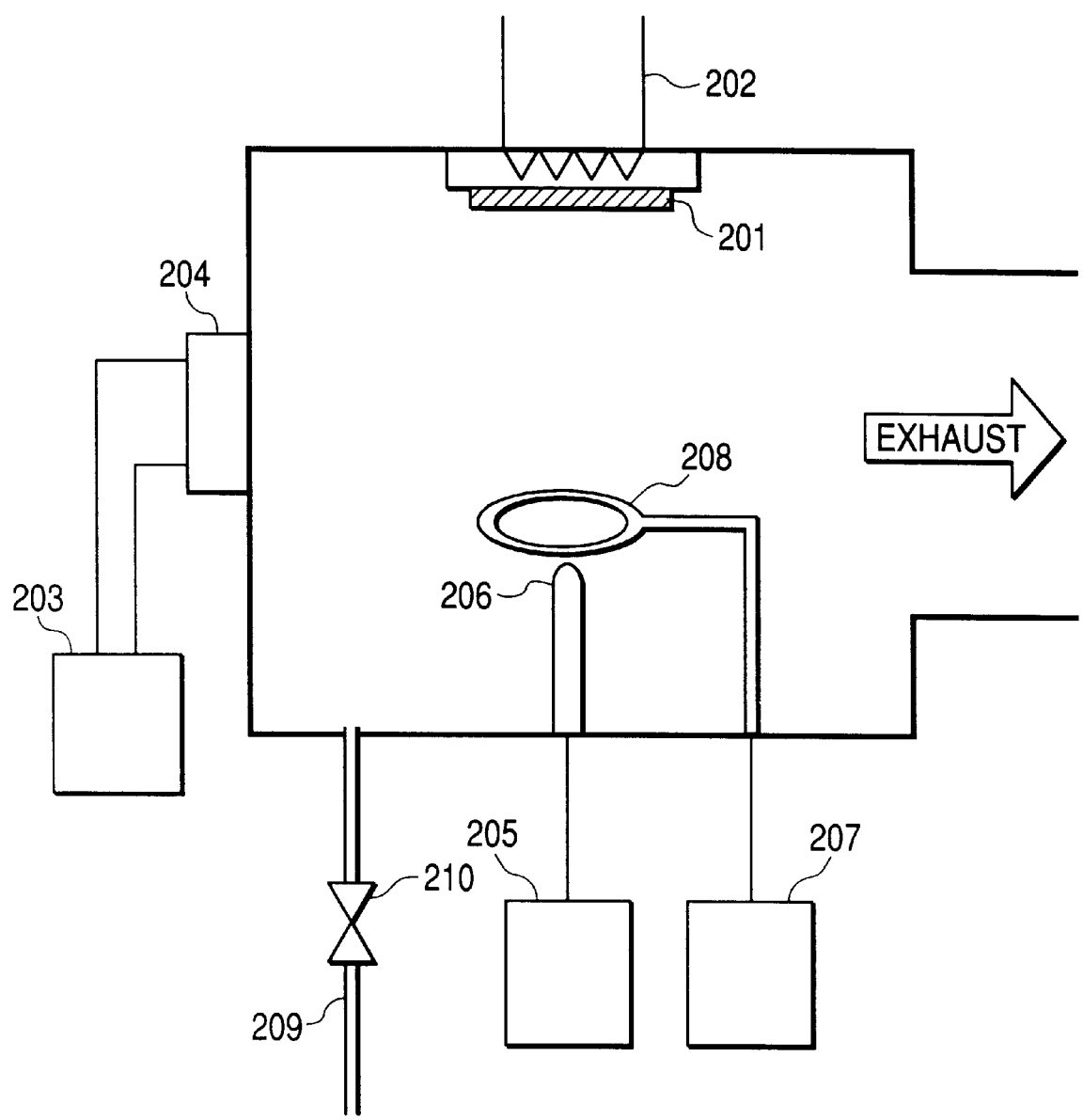
FIG. 2 is a schematic cross sectional view showing an apparatus for manufacturing a photovoltaic device according to the invention.

In the following examples, a semiconductor thin film forming apparatus as shown in FIG. 2 was used. Substrate 201 is held to an upper portion of the inner wall of the thin film forming apparatus and heated to desired temperature by means of heater 202. Source gases are introduced into the apparatus by way of gas introducing pipe 209 and valve 210. Source gases were highly refined gases including $SiH_4$ gas, $PH_3/H_2$ gas (dilution: 2%), $B_2H_6/H_2$ gas (dilution: 2%) and $H_2$ gas. For generating plasma, power sources with a microwave frequency (power source 203), a VHF (power source 205) and an RF (power source 207) were used independently or in combination. The effective volume of the plasma discharge space was about 3,000 cm$^3$. Prior to introducing source gases, the inside of the apparatus was evacuated to a degree of $10^{-5}$ Torr by means of a turbo-molecular pump. In FIG. 2, reference numeral 204 denotes a microwave introducing window and reference numeral 206 denotes a VHF electrode and reference numeral 208 denotes an RF electrode.

Preliminary Experiment 1

Prior to preparing specimens of photovoltaic devices, a monolayer film of non-doped microcrystalline silicon was formed and tested. The substrate was formed by depositing ZnO to a thickness of 0.5 μm on a 0.5 mm thick stainless steel plate by sputtering. Then, an i-type microcrystalline silicon film was formed by deposition to a thickness about 2 μm under the conditions listed in Table 1 (for high speed dep osition of small grain size microcrystalline silicon).

TABLE 1

|  | gas flow rate $SiH_4$ 80 sccm $H_2$ 2400 sccm |
|---|---|
| forming pressure | 150 mtorr |
| forming temperature | 350° C. |
| RF (13.56 MHz) power | 10 W |
| VHF (105 MHz) power | 500 W |
| forming rate | ~20 angstroms/second |

<Evaluation 1>

Figure 4:
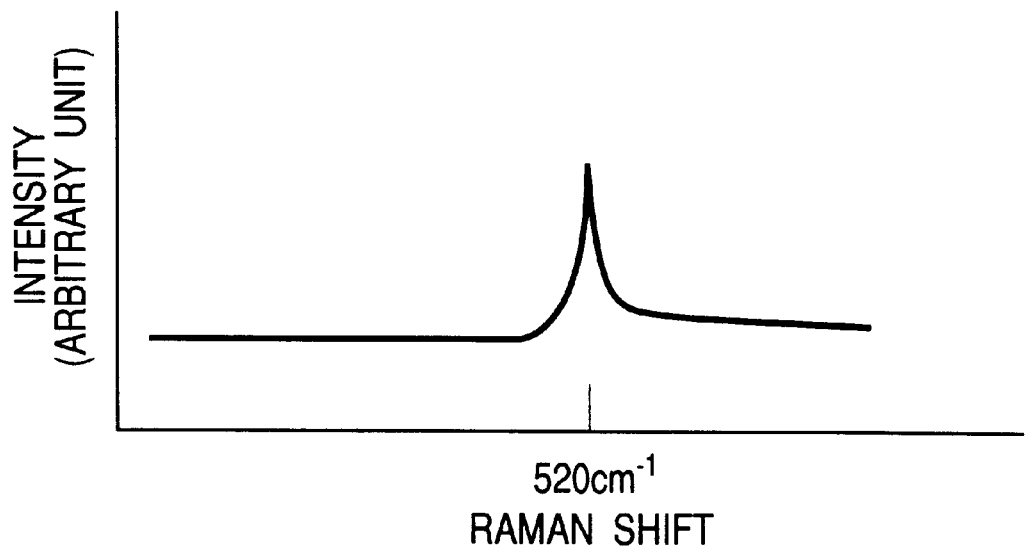
FIG. 4 is a graph showing the Raman shift of a device obtained in Preliminary Experiment 1.
Figure 5:
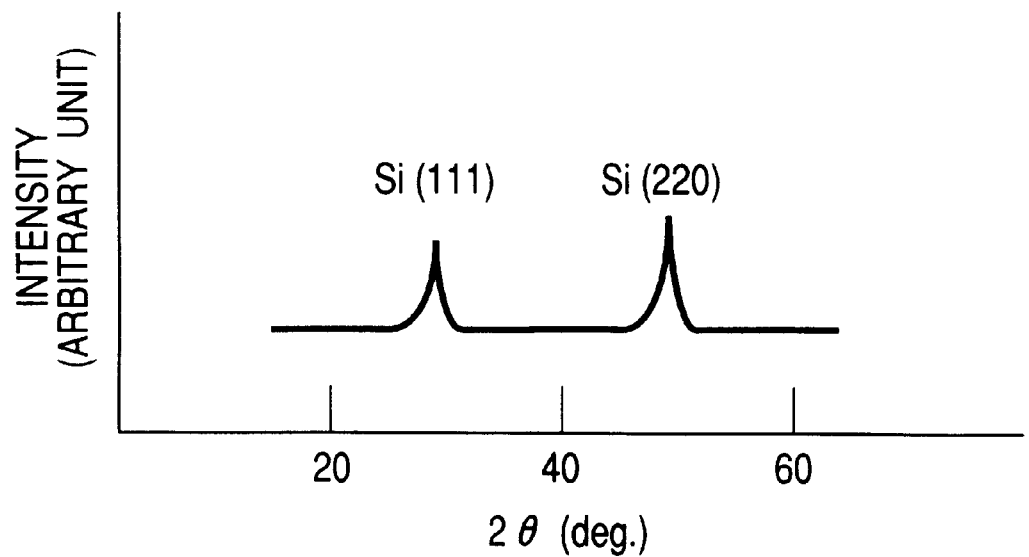
FIG. 5 is a graph showing the result obtained by X-ray diffractometry in Preliminary Experiment 1.

The microcrystalline silicon film formed in <Preliminary Experiment 1> was tested for evaluation by means of Raman scattering, X-ray diffraction and reflection infrared absorption. As shown in FIG. 4, the Raman shift obtained by Raman scattering showed a sharp peak at the wave number of around 520 cm$^{-1}$ to correspond to microcrystalline silicon. Then, the crystal grain size was estimated on the basis of the data obtained by X-ray diffraction (FIG. 5) and by means of Sherrer's formula: t=0.9 λ/Bcosθ (t: grain size, B: half-width, θ: Bragg angle). The estimated grain size was about 150 angstroms for (111) plane. The diffraction peak was slightly broad to suggest that the formed film was a mixture of microcrystalline silicon and amorphous silicon. The hydrogen content obtained by computation using the infrared absorption spectrum at and near the wave number of 2,100 cm$^{-1}$ obtained by reflection infrared absorption was about 6%

Preliminary Experiment 2

A microcrystalline silicon film was formed to a thickness of about 2 μm on a substrate same as that of Preliminary Experiment 1 under the conditions listed in Table 2 below (microcrystalline silicon having a large grain size, low speed deposition).

TABLE 2

|  | gas flow rate $SiH_4$ 80 sccm, $H_2$ 2,400 sccm |
|---|---|
| forming pressure | 150 mtorr |
| forming temperature | 350° C. |
| RF (13.56 MHz) power | 10 W |
| VHF (105 MHz) power | 100 W |
| forming rate | ~5 angstroms/second |

<Evaluation 2>

The microcrystalline silicon film formed in <Preliminary Experiment 2> was tested for evaluation by means of Raman scattering and X-ray diffraction. The Raman shift obtained by Raman scattering showed a sharp peak at the wave number of 520 cm$^{-1}$ to correspond to microcrystalline silicon. Then, the crystal grain size was estimated on the basis of the data obtained by X-ray diffraction and by means of Sherrer's formula: t=0.9 λ/Bcosθ (t: grain size, B: half-width, θ: Bragg angle). The estimated grain size was about 200 angstroms for (111) plane. The diffraction peak was slightly broad to suggest that the formed film was a mixture of microcrystalline silicon and amorphous silicon, although the crystallinity of the product seemed to be better than that of <Preliminary Experiment 2>. The hydrogen content obtained by computation using the infrared absorption spectrum at and near the wave number of about 2,100 cm$^{-1}$ obtained by reflection infrared absorption was about 4%.

Experiment Example 1

In this example, a solar cell having a configuration of FIG. 1 was prepared by using a film forming apparatus as shown in FIG. 2.

First, a substrate was prepared. A sheet of stainless steel with a thickness of 0.5 mm and a surface area of 50×50 mm$^2$ was immersed into a mixture of acetone and isopropylalcohol, cleansed with supersonic waves and dried with hot air. Then, an Ag film having a textured structure was deposited on the substrate at 300° C. to a film thickness of 0.8 μm by DC magnetron sputtering and thereafter a ZnO transparent electroconductive film having a textured structure was deposited at 300° C. to a film thickness of 4.0 μm also by DC magnetron sputtering.

Subsequently, a pin structure was formed on the ZnO transparent conductive film by means of a deposition apparatus. An n-type semiconductor layer was deposited to a film thickness of about 200 angstroms in a film forming apparatus (not shown) by means of RF waves under the conditions of Table 3. An i-type semiconductor layer was deposited to a film thickness of about 1.0 μm in the film forming apparatus of FIG. 2 by using both VHF (high frequency of 105 MHz) and RF (high frequency of 13.56 MHz) waves under the conditions of Table 1 (for small grain size crystals). A p-type semiconductor layer was deposited to a film thickness of about 100 angstroms by means of RF waves under the conditions of Table 4.

TABLE 3 film forming conditions for n-type semiconductor layer
(n-type microcrystalline silicon: film thickness 200 angstroms)

|  | gas flow rate<br>$SiH_4/H_2$ (10%) 4.0 sccm<br>$PH_3/H_2$ (2%) 1.0 sccm<br>$H_2$ 100 sccm |
|---|---|
| forming pressure | 1.0 Torr |
| forming temperature | 230° C. |
| RF (13.56 MHz) power | 15 W |
| forming rate | 0.4 angstroms/second |

TABLE 4 film forming conditions for p-type semiconductor layer
(p-type microcrystalline silicon: film thickness 100 angstroms)

|  | gas flow rate<br>$SiH_4/H_2$ (10%) 1.0 sccm<br>$PH_3/H_2$ (2%) 0.2 sccm<br>$H_2$ 35 sccm |
|---|---|
| forming pressure | 2.0 Torr |
| forming temperature | 170° C. |
| RF (13.56 MHz) power | 33 W |
| forming rate | 0.6 angstroms/second |

Subsequently, a transparent electrode of ITO was deposited to a thickness of about 600 angstroms by sputtering using an ITO target. Additionally, a collector electrode of Au was deposited to a thickness of about 8,000 angstroms by vacuum evaporation using electron beams.

The pin type solar cell will be referred to as (Cell-1) hereinafter (which corresponds to FIG. 3A).

Experiment Example 2

In this example, a solar cell was prepared under the conditions as listed above for <Experiment Example 1> except that the i-type semiconductor layer was formed by deposition to a thickness of about 1.0 μm under the conditions of Table 2 (for large grain size).

This solar cell will be referred to as (Cell-2) hereinafter (which corresponds to FIG. 3B).

Experiment Example 3

In this example, a solar cell was prepared under the conditions as listed above for <Experiment Example 1> except that the i-type semiconductor layer was formed only for an area near the n-type semiconductor layer by deposition to a thickness of about 1,000 angstroms under the conditions of Table 2 (for large grain size) and subsequently for the remaining area to a thickness of about 9,000 angstroms under the conditions of Table 1 (for small grain size).

This solar cell will be referred to as (Cell-3) hereinafter (which corresponds to FIG. 3C).

Experiment Example 4

In this example, a solar cell was prepared under the conditions as listed above for <Experiment Example 1> except that the i-type semiconductor layer was formed by deposition first on the n-type semiconductor layer to a thickness of about 9,000 angstroms under the conditions of Table 1 (for small grain size) and subsequently only for an area near the p-type semiconductor layer to a thickness of about 1,000 angstroms under the conditions of Table 2 (for large grain size).

This solar cell will be referred to as (Cell-4) hereinafter (which corresponds to FIG. 3D).

Experiment Example 5

In this example, a solar cell was prepared under the conditions as listed above for <Experiment Example 1> except that the i-type semiconductor layer was formed by deposition first on the n-type semiconductor layer to a thickness of about 1,000 angstroms under the conditions of Table 2 (for large grain size), secondly to a thickness of about 8,000 angstroms under the conditions of Table 1 (for small grain size) and subsequently only for an area near the p-type semiconductor layer to a thickness of about 1,000 angstroms under the conditions of Table 2 (for large grain size).

This solar cell will be referred to as (Cell-5) hereinafter (which corresponds to FIG. 3E).

Experiment Example 6

In this example, a solar cell was prepared under the conditions as listed above for <Experiment Example 1> except that the i-type semiconductor layer was formed only for an area near the n-type semiconductor layer by deposition to a thickness of about 1,000 angstroms under the conditions of Table 1 (for small grain size) and subsequently for the remaining area to a thickness of about 9,000 angstroms under the conditions of Table 2 (for large grain size).

This solar cell will be referred to as (Cell-6) hereinafter (which corresponds to FIG. 3F).

Experiment Example 7

In this example, a solar cell was prepared under the conditions as listed above for <Experiment Example 1> except that the i-type semiconductor layer was formed by deposition firstly on the n-type semiconductor layer to a thickness of about 9,000 angstroms under the conditions of Table 2 (for large grain size) and subsequently only for an area near the p-type semiconductor layer to a thickness of about 1,000 angstroms under the conditions of Table 1 (for small grain size).

This solar cell will be referred to as (Cell-7) hereinafter (which corresponds to FIG. 3G).

Experiment Example 8

In this example, a solar cell was prepared under the conditions as listed above for <Experiment Example 1> except that the i-type semiconductor layer was formed by deposition firstly on the n-type semiconductor layer to a thickness of about 1,000 angstroms under the conditions of Table 1 (for small grain size), secondly to a thickness of about 8,000 angstroms under the conditions of Table 2 (for large grain size) and subsequently only for an area near the p-type semiconductor layer to a thickness of about 1,000 angstroms under the conditions of Table 1 (for small grain size).

This solar cell will be referred to as (Cell-8) hereinafter (which corresponds to FIG. 3H).

Experiment Example 9

In this example, a solar cell was prepared under the conditions as listed above for <Experiment Example 1> except that the i-type semiconductor layer was formed on the n-type semiconductor layer by repeating 20 cycles of a first i-type unit layer formed under the conditions of Table 1 (for small grain size) and a second i-type unit layer formed under the conditions of Table 2 (for large grain size).

This solar cell will be referred to as (Cell-9) hereinafter (which corresponds to FIG. 3I).

Experiment Example 10

In this example, a solar cell was prepared under the conditions as listed above for <Experiment Example 1> except that the i-type semiconductor layer was formed in a manner as described below. After forming the n-type semiconductor layer, it was masked and the i-type semiconductor layer was formed to a thickness of 10,000 angstroms as stripes extending along the plane at regular intervals of 5 mm under the conditions of Table 1 (for small grain size). Then, the n-type semiconductor layer was masked differently so that the gaps among the stripes of the i-type semiconductor layer were filled also with the i-type semiconductor layer formed to a thickness of 10,000 angstroms under the conditions of Table 2 (for large grain size).

This solar cell will be referred to as (Cell-10) hereinafter (which corresponds to FIG. 3J).

Experiment Example 11

In this example, a solar cell was prepared under the conditions as listed above for <Experiment Example 1> except that the i-type semiconductor layer was formed in a manner as described below. Only the light receiving section of the i-type semiconductor layer was formed under the conditions of Table 1 (for small grain size) and the areas under the metal electrodes were formed under the conditions of Table 2 (for large grain size). The metal electrodes were arranged at regular intervals of 10 mm and therefore the i-type semiconductor layer was formed along the plane in a cyclic manner under the conditions of Table 1 (for small grain size) and those of Table 2 (for large grain size).

This solar cell will be referred to as (Cell-11) hereinafter (which corresponds to FIG. 3K).

Table 5 shows the open current voltage Voc, the short-circuit current density Isc, the fill factor FF, the conversion efficiency η and the optical stability S (percentage of the reduction in the conversion efficiency after irradiation with 1 SUN for 500 hours) observed for each cell and compared with (Cell-2), which was used as reference.

TABLE 5

(Characteristics of Cells)

| cell No. | Voc | Isc | FF | η | S |
|---|---|---|---|---|---|
| (Cell-2) | 1.00 | 1.00 | 1.00 | 1.00 | 1.00 |
| (Cell-1) | 0.90 | 1.31 | 0.84 | 0.99 | 0.95 |
| (Cell-3) | 0.92 | 1.28 | 0.86 | 1.01 | 0.96 |
| (Cell-4) | 0.93 | 1.30 | 0.88 | 1.06 | 0.98 |
| (Cell-5) | 0.97 | 1.30 | 0.92 | 1.16 | 0.99 |
| (Cell-6) | 0.98 | 1.05 | 1.02 | 1.05 | 0.99 |
| (Cell-7) | 0.97 | 1.08 | 1.02 | 1.07 | 0.99 |
| (Cell-8) | 0.98 | 1.11 | 1.06 | 1.15 | 0.99 |
| (Cell-9) | 1.05 | 1.10 | 1.20 | 1.39 | 1.00 |
| (Cell-10) | 1.01 | 1.12 | 0.98 | 1.11 | 0.98 |
| (Cell-11) | 1.02 | 1.30 | 0.90 | 1.19 | 0.96 |

Each of (Cell-3) through (Cell-5) that had grain sizes larger near the p- and n-interfaces than in the i-type semiconductor layer bulk region showed improved Voc and FF and hence η of the cell when compared with (Cell-1). The optical stability S was also improved in these cells. On the other hand, each of (Cell-6) through (Cell-8) that had grain sizes conversely smaller near the p- and n- interfaces than in the i-type semiconductor layer bulk region showed improved Isc and FF and hence η of the cell when compared with (Cell-2). The optical stability S was not significantly reduced in these cells because the small grain size region had a sufficiently small film thickness. (Cell-9) that had a cyclically changing grain size showed a remarkably improved FF and hence η of the cell was also significantly improved.

Meanwhile, (Cell-10) that had an uneven grain size distribution in the surface direction also showed an improved Isc to improve the η. (Cell-11) that had a cyclic grain size distribution in the surface direction in such a way that the grain size is maximal right under the metal electrodes also showed a similar improvement.

Experiment Example 12

In this example, the procedures of <Experiment Example 5> were followed, basically using the conditions of Table 1 and Table 2, to prepare specimens with varied hydrogen contents, although the grain size was not changed. Table 6 shows the obtained result. As shown in Table 6, a well-performing cell was obtained when the hydrogen content was made lower under the conditions of Table 2 (for large grain size) than under the con ditions of Table 1 (for small grain size). The cell prepared with a hydrogen content $C_H$ 10% or less under the conditions of Table 2 (for large grain size) and a hydrogen content $C_H$ between 3 and 20% under the conditions of Table 1 (for small grain size) showed excellent characteristics. The above findings were not limited to <Experiment Example 5> but applicable to all of the preceding experiment examples.

TABLE 6

Stabilizing Efficiency

| $C_H$ for small grain size (%) | $C_H$ for large grain size (%) | | | | | |
|---|---|---|---|---|---|---|
| | less than 1% | 5 | 10 | 15 | 20 | 30 |
| less than 1% | Δ | Δ | Δ | Δ | x | x |
| 2 | Δ | Δ | Δ | Δ | x | x |
| 3 | ○ | Δ | Δ | Δ | x | x |
| 4 | ⊙ | Δ | Δ | Δ | x | x |

TABLE 6-continued

Stabilizing Efficiency

| $C_H$ for small grain size (%) | $C_H$ for large grain size (%) | | | | | |
|---|---|---|---|---|---|---|
| | less than 1% | 5 | 10 | 15 | 20 | 30 |
| 5 | ⊚ | ○ | Δ | Δ | x | x |
| 10 | ⊚ | ⊚ | ○ | Δ | x | x |
| 15 | ⊚ | ⊚ | ⊚ | Δ | x | x |
| 20 | ○ | ○ | ○ | Δ | x | x |
| 25 | Δ | Δ | x | x | x | x |

⊚: excellent, ○: good, Δ: permissible, x: no good

Experiment Example 13

In this example, the procedures of <Experiment Example 5> were followed, varying the conditions of Table 1 and Table 2, to prepare specimens. The grain size produced under the conditions of Table 2 (for large grain size) was always made greater than the grain size produced under the conditions of Table 1 (for small grain size). The performance of the cell was tested by varying the ratio of the grain size produced under the conditions of Table 2 (for large grain size) to the grain size produced under the condition of Table 1 (for small grain size). Table 7 shows the obtained result. As seen from Table 7, the cell performed well when the ratio of the small grain size to the large grain size was 0.9 or less.

TABLE 7

| Conversion Efficiency η and Optical Stability S | | |
|---|---|---|
| grain size ratio (small/large) | η | S |
| 0.20 | ○ | Δ |
| 0.40 | ○ | Δ |
| 0.60 | ○ | ○ |
| 0.80 | ○ | ○ |
| 0.85 | ○ | ○ |
| 0.9 | Δ | ○ |
| 0.95 | x | ○ |

○: good, Δ: permissible, x: no good

Experiment Example 14

In this example, specimens of pin type solar cell having a grain size distribution as shown in FIG. 3E were prepared by extensively varying the grain size to see the performance. Table 8 shows the obtained result. As seen from Table 8, the cell performed well when it comprises microcrystalline silicon having a minimum average grain size between 20 angstroms and 1 μm and microcrystalline silicon or polycrystalline silicon having a maximum average grain size between 50 angstroms and 10 mm.

TABLE 8

| | Stabilizing Efficiency | | | | | |
|---|---|---|---|---|---|---|
| minimum average grain size | maximum average grain size | | | | | |
| | 30 ang. | 50 ang. | 1 μm | 1 mm | 10 mm | 30 mm |
| 10 ang. | x | Δ | Δ | Δ | Δ | Δ |
| 20 ang. | Δ | ○ | ○ | ○ | ○ | Δ |

TABLE 8-continued

| | Stabilizing Efficiency | | | | | |
|---|---|---|---|---|---|---|
| minimum average grain size | maximum average grain size | | | | | |
| | 30 ang. | 50 ang. | 1 μm | 1 mm | 10 mm | 30 mm |
| 100 ang. | — | — | ⊚ | ⊚ | ⊚ | Δ |
| 500 ang. | — | — | ○ | ⊚ | ⊚ | ○ |
| 1 μm | — | — | — | ⊚ | ⊚ | ○ |
| 5 μm | — | — | — | ○ | ○ | Δ |

⊚: excellent, ○: good, Δ: permissible, x: no good

Experiment Example 15

In this example, specimens of pin-type solar cell having a grain size distribution as shown in FIG. 3E were prepared by controlling the rate of doping the inside of the n-type semiconductor layer and hence the dopant (phosphor) concentration in an area near the n/i interface in the i-type semiconductor layer. The dopant (phosphor) concentration in the area near the n/i interface in the n-type semiconductor layer was observed by means of SIMS after the i-type and p-type semiconductor layers. Table 9 shows the obtained result. As seen from Table 9, the cell performed well when the dopant (phosphor) concentration in the area near the n/i interface in the i-type semiconductor layer was $2 \times 10^{17}$ cm$^{-3}$ or less.

TABLE 9

| Conversion Efficiency and Optical Stability S | | |
|---|---|---|
| phosphor concentration; (cm$^{-3}$) | η | S |
| $8 \times 10^{16}$ | ○ | ○ |
| $2 \times 10^{17}$ | ○ | ○ |
| $8 \times 10^{17}$ | Δ | ○ |
| $2 \times 10^{18}$ | x | Δ |
| $8 \times 10^{18}$ | x | x |

○: good, Δ: permissible, x: no good

Experiment Example 16

In this example, specimens of pin-type solar cell having a grain size distribution as shown in FIG. 3E were prepared, using microcrystalline silicon for the n-type semiconductor layer and/or the p-type semiconductor layer. Table 10 shows the obtained result. As seen from Table 10, the fill factor showed a remarkable improvement to make the pin-type cell perform excellently when compared with known cells using amorphous silicon for the n-type semiconductor layer and/or the p-type semiconductor layer.

TABLE 10

| Fill Factor FF and Conversion Efficiency η (Relative Value) | | |
|---|---|---|
| n-type and p-type semiconductor layers | FF | η |
| amorphous silicon for both n and p | 1.00 | 1.00 |
| microcrystalline silicon only for n | 1.05 | 1.08 |
| microcrystalline silicon only for p | 1.20 | 1.13 |
| microcrystalline silicon for both n and p | 1.20 | 1.27 |

Experiment Example 17

In this example, specimens of pin-type solar cell having a grain size distribution as shown in FIG. 3E were prepared and a 100 angstrom thick layer of i-type amorphous silicon was inserted into the p/i interface and/or n/i interface of the specimens. Table 11 shows the obtained result. As seen from Table 11, the open current voltage and the fill factor were remarkably improved by inserting an i-type amorphous silicon layer into the p/i interface and/or n/i interface. The performance of the pin-type was also improved.

TABLE 11

Open Current Voltage Voc, Fill Factor FF and Conversion Efficiency η (Relative Value)

| i-type amorphous silicon interface layer | Voc | FF | η |
|---|---|---|---|
| none | 1.00 | 1.00 | 1.00 |
| only on n/i interface | 1.03 | 1.05 | 1.10 |
| only on p/i interface | 1.10 | 1.12 | 1.29 |
| on both n/i and p/i interfaces | 1.13 | 1.15 | 1.36 |

Experiment Example 18

In this example, conditions good for forming non-single crystal silicon to be used for a photovoltaic device according to the invention by means of high frequency plasma CVD were studied. As a result, it was found that optimal conditions include a frequency between 50 and 2,450 MHz, a forming pressure between 0.001 and 0.5 Torr and a making power density between 0.001 and 0.5 W/cm$^3$. As for frequency, it was found that the use of a relatively high frequency within the above defined range can easily raise the film forming rate. On the other hand, the use of a relatively low frequency within the above defined range can maintain the electric discharge and hence is advantageous for improving the performance of the cell and the yield of manufacturing such cells in addition to the advantage of improving the film forming rate and cost reduction. As for forming pressure, it was found that the use of relatively low pressure within the above defined range can form a highly microcrystalline silicon film although optimal pressure can vary depending on the frequency to be used. Finally, as for making power density, it was found that the use of a relatively large making power density within the above defined range can improve the film forming rate, although excellent microcrystalline silicon film can be obtained under high speed film forming conditions by selecting appropriate values for the frequency and the forming pressure. In short, the above ranges for frequency, forming pressure and making power density are advantageous for forming high quality microcrystalline silicon film at low cost.

As described above, according to the invention, a photovoltaic device and a photoelectric transducer having an excellent photoelectric conversion efficiency and a remarkable optical stability can be manufactured at low cost. Additionally, according to the invention, a photovoltaic device having large area and excellent mass productivity can be prepared by use of high frequency plasma CVD.

What is claimed is:

1. A photovoltaic device having a pin-structure semiconductor layer formed by superposing a p-type semiconductor layer, an i-type semiconductor layer and an n-type semiconductor layer, wherein the i-type semiconductor layer comprises a non-single crystal semiconductor and average grain size distribution of crystal grains of the i-type semiconductor layer is not uniform.

2. The photovoltaic device according to claim 1, wherein the average grain size distribution of the crystal grains contained in the i-type semiconductor layer is not uniform in the film thickness direction.

3. The photovoltaic device according to claim 1, wherein the average grain size of the crystal grains in the i-type semiconductor layer in a region near the interface of the i-type semiconductor layer and the p-type semiconductor layer and/or that of the i-type semiconductor layer and the n-type semiconductor layer is greater than the average grain size of the crystal grains in the remaining regions of the i-type semiconductor layer.

4. The photovoltaic device according to claim 1, wherein the average grain size distribution of the crystal grains contained in the i-type semiconductor layer changes cyclically.

5. The photovoltaic device according to claim 1, wherein the average grain size distribution of the crystal grains contained in the i-type semiconductor layer is not uniform in the surface direction perpendicular to the film thickness direction.

6. The photovoltaic device according to claim 1, wherein the hydrogen content of the region having the largest average grain size in the i-type semiconductor layer is smaller than the hydrogen content of the remaining regions of the i-type semiconductor layer.

7. The photovoltaic device according to claim 6, wherein the hydrogen content of the region having the largest average grain size in the i-type semiconductor layer is 10% or less and the hydrogen content of the remaining regions of the i-type semiconductor is between 3 and 20%.

8. The photovoltaic device according to claim 1, wherein the ratio of the smallest average grain size to the largest average grain size is 0.9 or less.

9. The photovoltaic device according to claim 1, wherein the non-single crystal semiconductor comprises microcrystalline semiconductor with the largest average grain size between 20 angstroms and 1 μm, and microcrystalline semiconductor or polycrystalline semiconductor with the largest average grain size between 50 angstroms and 10 mm.

10. The photovoltaic device according to claim 1, wherein the non-single crystal semiconductor comprises non-single crystal silicon.

11. The photovoltaic device according to claim 1, wherein the dopant concentration in a region in the i-type semiconductor layer located near the interface of the n-type semiconductor is $2 \times 10^{17}$ cm$^{-3}$ or less.

12. The photovoltaic device according to claim 1, wherein the p-type semiconductor layer and/or the n-type semiconductor layer comprise a microcrystalline semiconductor.

13. The photovoltaic device according to claim 1, wherein the i-type semiconductor layer comprises an amorphous semiconductor layer located between the i-type semiconductor layer and the p-type semiconductor layer and/or the n-type semiconductor layer.

14. The photovoltaic device according to claim 1, wherein the i-type semiconductor layer is formed by high frequency plasma CVD under the conditions of a frequency between 50 and 2,450 MHz, pressure between 0.001 and 0.5 Torr and a making power density between 0.001 and 0.5 W/cm$^3$.

15. A photoelectric transducer having a pin-structure semiconductor layer formed by superposing a p-type semiconductor layer, an i-type semiconductor layer and an n-type semiconductor layer, wherein the i-type semiconductor layer comprises a non-single crystal semiconductor and average grain size distribution of crystal grains of the i-type semiconductor layer is not uniform.

16. The photoelectric transducer according to claim 15, wherein the average grain size distribution of the crystal grains contained in the i-type semiconductor layer is not uniform in the film thickness direction.

17. The photoelectric transducer according to claim 15, wherein the average grain size of the crystal grains in the i-type semiconductor layer in a region near the interface of the i-type semiconductor layer and the p-type semiconductor layer and/or that of the i-type semiconductor layer and the n-type semiconductor layer is greater than the average grain size of the crystal grains in the remaining regions of the i-type semiconductor layer.

18. The photoelectric transducer according to claim 15, wherein the average grain size distribution of the crystal grains contained in the i-type semiconductor layer changes cyclically.

19. The photoelectric transducer according to claim 15, wherein the average grain size distribution of the crystal grains contained in the i-type semiconductor layer is not uniform in the surface direction perpendicular to the film thickness direction.

20. The photoelectric transducer according to claim 15, wherein the hydrogen content of the region having the largest average grain size in the i-type semiconductor layer is smaller than the hydrogen content of the remaining regions of the i-type semiconductor layer.

21. The photoelectric transducer according to claim 20, wherein the hydrogen content of the region having the largest average grain size in the i-type semiconductor layer is 10% or less and the hydrogen content of the remaining regions of the i-type semiconductor is between 3 and 20%.

22. The photoelectric transducer according to claim 15, wherein the ratio of the smallest average grain size to the largest average grain size is 0.9 or less.

23. The photoelectric transducer according to claim 15, wherein the non-single crystal semiconductor comprises microcrystalline semiconductor with the largest average grain size between 20 angstroms and 1 $\mu$m, and monocrystalline semiconductor or polycrystalline semiconductor with the largest average grain size between 50 angstroms and 10 mm.

24. The photoelectric transducer according to claim 15, wherein the non-single crystal semiconductor comprises non-single crystal silicon.

25. The photoelectric transducer according to claim 15, wherein the dopant concentration in a region in the i-type semiconductor layer located near the interface of the n-type semiconductor layer is $2 \times 10^{17}$ cm$^{-3}$ or less.

26. The photoelectric transducer according to claim 15, wherein the p-type semiconductor layer and/or the n-type semiconductor layer comprise a microcrystalline semiconductor.

27. The photoelectric transducer according to claim 15, wherein the i-type semiconductor layer comprises an amorphous semiconductor layer located between the i-type semiconductor layer and the p-type semiconductor layer and/or the n-type semiconductor layer.

28. The photoelectric transducer according to claim 15, wherein the i-type semiconductor layer is formed by high frequency plasma CVD under the conditions of a frequency between 50 and 2,450 MHz, pressure between 0.001 and 0.5 Torr and a making power density between 0.001 and 0.5 W/cm$^3$.

29. A method of manufacturing a photovoltaic device having a pin-structure semiconductor layer formed by superposing a p-type semiconductor layer, an i-type semiconductor layer and an n-type semiconductor layer, wherein the i-type semiconductor layer is formed by (a) providing high frequency plasma CVD under the conditions of a frequency between 50 and 2,450 MHz, pressure between 0.001 and 0.5 Torr and a power density between 0.001 and 0.5 W/cm$^3$; and (b) changing at least one of the conditions during the i-type semiconductor layer formation, wherein the average grain size distribution of the crystal grains in the i-type semiconductor layer is rendered non-uniform.

30. A method of manufacturing a photoelectric transducer having a pin-structure semiconductor layer formed by superposing a p-type semiconductor layer, an i-type semiconductor layer and an n-type semiconductor layer, wherein the i-type semiconductor layer is formed by (a) providing high frequency plasma CVD under the conditions of a frequency between 50 and 2,450 MHz, pressure between 0.001 and 0.5 Torr and a power density between 0.001 and 0.5 W/cm$^3$; and (b) changing at least one of the conditions during the i-type semiconductor layer formation, wherein the average grain size distribution of the crystal grains in the i-type semiconductor layer is rendered non-uniform.

* * * * *

UNITED STATES PATENT AND TRADEMARK OFFICE
CERTIFICATE OF CORRECTION

PATENT NO. : 6,043,427
DATED : March 28, 2000
INVENTOR(S) : TOMONORI NISHIMOTO

It is certified that error appears in the above-identified patent and that said Letters Patent is hereby corrected as shown below:

ON THE TITLE PAGE:

[56] References Cited, under *Attorney, Agent, or Firm*:

"Fitzpatrick, Cella Harper & Scinto" should read
--Fitzpatrick, Cella, Harper & Scinto--.

COLUMN 9:

Line 36, "rage" should read --range--.

COLUMN 11:

Line 50, "dep osition" should read --deposition--.

COLUMN 13:

Table 4, "$PH_3/H_2$ (2%) 0.2cssm" should read
--$BH_3/H_2$ (2%) 0.2cssm--;

UNITED STATES PATENT AND TRADEMARK OFFICE
CERTIFICATE OF CORRECTION

PATENT NO. : 6,043,427
DATED : March 28, 2000
INVENTOR(S) : TOMONORI NISHIMOTO

It is certified that error appears in the above-identified patent and that said Letters Patent is hereby corrected as shown below:

COLUMN 17:

Line 26, "condition" should read --conditions--.

Signed and Sealed this

Seventeenth Day of April, 2001

Attest:

NICHOLAS P. GODICI

*Attesting Officer*     *Acting Director of the United States Patent and Trademark Office*